United States Patent [19]

Wilson et al.

[11] Patent Number: 4,627,029
[45] Date of Patent: Dec. 2, 1986

[54] INFORMATION HOLDING DEVICE

[75] Inventors: Edward G. Wilson; David Bloor, both of London, England

[73] Assignee: QMC Industrial Research Limited, London, England

[21] Appl. No.: 591,939

[22] Filed: Mar. 21, 1984

Related U.S. Application Data

[63] Continuation-in-part of Ser. No. 420,000, Sep. 20, 1982, Pat. No. 4,534,015.

[30] Foreign Application Priority Data

Mar. 25, 1983 [GB] United Kingdom ................. 8308309

[51] Int. Cl.$^4$ ...................... G11C 13/02; G11C 13/04
[52] U.S. Cl. ................................... 365/107; 365/120; 365/127
[58] Field of Search .................... 365/63, 64, 106, 107, 365/120, 127

[56] References Cited

U.S. PATENT DOCUMENTS

| 2,833,936 | 5/1958 | Ress . | |
| 3,123,806 | 3/1964 | Alburger | 365/107 |
| 3,668,106 | 6/1972 | Ota | 365/107 |
| 3,745,538 | 7/1973 | Sharp | 365/107 |
| 3,977,009 | 8/1976 | Ohtsuka | 365/153 |
| 4,534,015 | 8/1985 | Wilson . | |

FOREIGN PATENT DOCUMENTS 0021695 1/1981 European Pat. Off. .
2104287 3/1983 United Kingdom .

OTHER PUBLICATIONS

Chemical Abstracts, vol. 95, No. 2, Jul. 13, 1981, p. 399, No. 95:13197f.
Physical Technology, Technological Applications of Langmuir–Blodgett Films, G. G. Roberts, P. S. Vincent and W. A. Barlow, 1981, vol. 12(2), pp. 69–75 & 85.
Chemistry in Britain, Nov. 1983, "Monolayers Molecular Self-Organization" and Lucy Netzer, Radu Iscovici and Jacob Sagir, "Absorbed Monolayers Versus Langmuir–Blodgett Monolayer to Monolayer, by Adsorption", Thin Solid Films, 99, (1983), 235–241.

Primary Examiner—Terrell W. Fears
Attorney, Agent, or Firm—McAulay, Fields, Fisher, Goldstein & Nissen

[57] ABSTRACT

A memory comprises a multilayer film (1) in which each layer (2) is capable of carrying a charge, built up by successive deposition of a plurality of monomolecular layers (2), at least one of which has been deposited by a process of chemisorption and a photo-injector layer (D) is located on one side of the film for introducing charges into the film in a time sequence which corresponds to the information to be carried. Means (6) are provided for applying a voltage between the faces of the film to cause the charge carried by any layer to be transferred to the adjacent layer. The sequence of charges carried by the film may be read out by a photon-emitting electron arrival detector (F) on the opposite side of the film, or by a method of current differentiation. The film (1) is preferably formed of a polydiacetylene.

19 Claims, 16 Drawing Figures

INFORMATION HOLDING DEVICE

The present application is a continuation-in-part application of patent application Ser. No. 420,000, filed Sept. 20, 1982, now U.S. Pat. No. 4,534,015, issued Aug. 6, 1985.

This invention relates to an information holding device. The device is referred to below as a memory, though it is to be understood that the information may be held only briefly, in which case the device may function, for example, as a delay line, or the information may be held for a longer time, in which case the device may function as a normal memory.

In recent years, memories have been developed for example for computers, which have been increasingly compact, but there is, nevertheless, a demand for still more compact memories. An object of the present invention is to provide such a memory, and in particular a memory employing a film made up of chemically deposited monomolecular layers.

The present invention provides a memory for carrying information comprising a multilayer film built up by successive deposition of a plurality of monomolecular layers, at least one of which has been deposited by a process of chemisorption and in which each layer is capable of carrying a charge; means for introducing charges into one side of the film in a time sequence which corresponds to the information to be carried; means for applying a voltage between the faces of the film to cause the charge carried by any layer to be transferred to the adjacent layer; and means for reading out the sequence of charges carried by the film.

Many molecules having a hydrophilic and hydrophobic end, for example long chain fatty acids, form insoluble monolayers at an air-water interface. The packing in the monolayer may be controlled by the application of surface pressure through barriers and the equation of state of the film is given by the surface pressure-area isotherm. When an appropriate substrate, for example glass, silicon or indium phosphide, is dipped through the air-water interface then one monolayer may be transferred to the substrate each time the interface is traversed. A film of great perfection can thus be built up a single monolayer at a time. Such films are known as Langmuir-Blodgett films (hereinafter referred to as L-B films). It has been demonstrated that it is possible to build up extremely precise super-molecular structures consisting of fatty acids, long-chain dyes and similar molecules for the study of electron and exciton transport. More recently it has been demonstrated that fatty acids with certain substituents, for example a diacetylene group, may be polymerized either at the air-water interface or after the film has been prepared.

Charge and energy transport in L-B films will now be summarized.

(a) Electron tunneling

Monolayers of fatty acids with varying chain lengths, and hence varying thickness, have been prepared as a sandwich between conducting aluminium layers. The electrical conductivity of such films has been demonstrated to decrease logarithmically with increasing monolayer thickness. This is the result which would be expected if the currents were due to electrons tunneling through the dielectric monolayers. With some reservations this view is generally accepted as is the conclusion that these experiments demonstrate the remarkably perfect quality of the monolayers.

(b) Exciton transfer

Monolayers of dye substituted fatty acids commonly exhibit the characteristic absorption and fluorescence spectra of the isolated dye. Detailed investigations have been made of energy transfer from one type of dye in one monolayer to a second type of dye in neighbouring or more distant monolayers. If for example a sensitizer dye S which absorbs in the UV and emits in the blue is incorporated in an L-B film assembly with an acceptor dye A which absorbs in the blue and emits in the yellow then considerable energy transfer can occur. Under UV illumination the blue fluorescence is partially quenched by the presence of dye A and yellow fluorescence appears. The relative quenching of dye A fluorescence depends upon the proximity of dye S in a manner predicted by the classical electric dipole model.

(c) Photoinduced electron transfer,

Electron as well as exciton transfer has been observed between different chromophores in multilayer assemblies. In this case when the photon is absorbed an electron is transferred from one molecule acting as the donor D to the second acting as acceptor A. Quenching of fluorescence is observed in monolayer assemblies if donor and acceptor are in the same monolayer or at the hydrophilic interface between adjacent monolayers. When D and A layers are separated by a single fatty acid monolayer it has been possible to observe this transfer as a photocurrent.

(d) Compensated photoinduced electron transfer

In general the photoinduced electron transfer D-A is reversible and in the dark the electron will return A-D. The reverse process can be inhibited if an electron source molecule ES can supply an electron to the photooxidized donor. This possibility has been demonstrated by a monolayer sandwich: ES (leucostearylenblue), D ($\omega$-pyrenestearate), fatty acid, A (dioctadecyl-bipyridinium). Under illumination the system acted as an inefficient electron pump.

(e) Photoinduced electron release

Photocurrents can be generated from a layer of an absorbing molecule located in a film of fatty acid layers if the excited state energy level of the absorber lies close to the potential barrier of the fatty acid layers. It is known that this is possible for the linear conjugated molecule quinquethienyl for which the excited state lies 0.4 eV below the potential barrier of arachidate layers.

The potential of the L-B multilayer technique for the fabrication of supramolecular structures has been amply demonstrated, as described above. However, the practical application of structures with photo-excited energy and charge transfer has been inhibited by the poor stability of L-B multilayers primarily composed of fatty acids. This arises from the low melting points of the long-chain fatty acids and the large amplitude molecular motions, which give rise to solid-state phase transitions below the melting points of paraffinic crystals. Thus, the ceiling temperature of fatty-acid L-B multilayers is close to room temperature and they exhibit pronounced ageing, with consequent changes in physical properties, due to molecular re-arrangement within the L-B layers.

One solution to this problem, which has been extensively studied over a number of years, is the inclusion in the monolayer-forming molecules of reactive units capable of producing polymer chains within the layer. Such reactions can occur in L-B layers since the molecular packing within each layer brings the reactive units into close contact. Molecules containing double bonds were studied first, e.g. vinyl stearate and octadecyl methacrylate. Polymerization was observed with UV and electron beam irradiation but the materials were found to oxidise readily, so that all film preparation had to be carried out in an inert atmosphere, and the dimensional changes on polymerization gave a rather imperfect product.

The solid-state topochemical polymerization of certain di-substituted diacetylenes has been known for some time. This polymerization is insensitive to normal atmosphere and there followed development to investigate the properties of L-B films made from fatty-acids containing diacetylinic units. The topochemical polymerization was found to occur under UV in irradiation in air and the dimensional changes were sufficiently small that the final films were as perfect as the initial monomer films.

The stability and quality of polydiacetylene L-B multilayers has been shown by their inclusion in MIS devices. Although the conditions for the formation of pin-hole free L-B monolayers are more stringent than those for the unsubstituted fatty acids they are now well documented in the literature so that routine fabrication is possible. The ceiling temperature of polydiacetylene L-B films has not been critically determined. Values in excess of 200° C. are to be expected since this is the regime in which polydiacetylene crystals are observed to decompose. In one case the first stage of this decomposition has been identified as cleavage of the bulky, reactive sidegroups, probably initiated by absorbed oxygen. This suggests that diacetylenes with less reactive paraffinic sidegroups are likely to decompose at higher temperatures. Ageing of the polymerized films should be negligible since on polymerization the paraffinic side chains are locked in place by the polymer chains, which prevents any translational motion either in or out of the plane of the film. This is revealed most dramatically by the disappearance of phase transitions in both the pure acids and their salts. It should be emphasised that the incorporation of polydiacetylene chains into L-B multilayers offers benefits in addition to providing more durable films. These derive from the properties of the PDA chain, which is a wide band-gap wide band semiconductor with strong electron-hole interaction. Thus the PDA chains can play an active role in the photo-excitation of energy and charge transfer through L-B multilayer structures.

The electronic and vibrational excitations of the conjugated polydiacetylene backbone are now very well understood. Optical absorption and reflection spectroscopy have demonstrated the existence of an exciton state on the backbone at approximately 2 eV while photoconduction measurements have shown that the conduction band lies 2.4 eV above the valence band. Resonance Raman spectroscopy has revealed that only a few photons on the backbone are strongly coupled to the exciton. The most prominent of these are at 2100 $cm^{-1}$ and 1500 $cm^{-1}$; lattice dynamical analysis of the backbone has shown that the former mode primarily involves distortion of the triple bond while the latter involves the double bond.

The present invention makes use of multilayer films in which at least one of the monomolecular layers has been deposited by a process of chemisorption. In this way it is possible to build up a film made up of monomolecular layers of great regularity and having a structure similar to the L-B films described above. As used herein the term "chemisorption" means deposition of a monomolecular layer by chemical reaction of a reactive group in the molecule being deposited with a reactive group on a substrate or on the exposed surface of an already deposited monomolecular layer. It will generally be necessary to produce the reacting groups on the substrate by an activation step prior to the chemisorption step.

It should be noted that the chemisorption reaction can be either a liquid phase reaction, for example carried out in a suitable solvent, or a gas phase reaction. The latter possibility may be preferred in many cases.

According to the invention it is possible to build up the multilayer film using chemisorption alone or by combining chemisorption with the L-B technique described above. In the latter case a suitable substrate can be provided with an initial monomolecular layer by an L-B technique and further layers built up by chemisorption or vice versa. Alternatively, the two techniques can be combined as desired as the multilayer film is built up.

In order to ensure that only a monolayer is deposited by chemisorption, it is necessary that the molecule being deposited has only a single group which is reactive under the conditions of the chemisorption with the substrate or the activated previously deposited monolayer. To allow a further monolayer to be deposited the exposed surface of a previously deposited monolayer must be activated by introducing a further reactive group or exposing a reactive group already present in protected form.

One way in which films can be built up by chemisorption is by use of a substrate which has free surface hydroxyl groups, such as a metal or semi-conductor e.g. a silicon crystal. Free hydroxyl groups occur naturally on clean surfaces exposed to the atmosphere and best results can be obtained from plasma cleaned surfaces. These free hydroxyl groups can be reacted, for example, with an appropriate silicon halide to form a monomolecular layer bound to the surface by silicon-oxygen linkages. Thus a compound of formula $Hal_3SiX$ (where Hal is halogen, preferably chlorine) reacts with free surface hydroxyl groups to give the structure

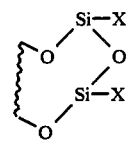

The group X can be terminated by a vinyl (—CH=CH$_2$) group which is a non-polar moiety chemically compatible with the formation of closely packed monolayers. The vinyl group can readily be converted into a —CH$_2$CH$_2$OH by known methods, for example treatment with diborane in tetrahydrofuran followed by oxidation with alkaline hydrogen peroxide. This gives a monomolecular layer with surface hydroxyl groups which can again be reacted with Cl$_3$SiX to give another layer. Repetition of this series of operations builds up a film composed of monomolecular layers of great regularity.

A similar series of operations is possible using amine or carboxyl groups on the surface. Thus the substrate for chemisorption may be a polar surface prepared by the L-B technique. Using molecules with acid end groups a surface containing —CO$_2$H surface groups can be prepared and chemisorption can be carried out using a molecule with a terminal —NH$_2$ group, or vice versa. This method can be particularly suitable if the multilayer film is to be fabricated on an insulating rather than a semi-conducting substrate.

The terminal vinyl group referred to above can be replaced by a leaving group and the previously deposited monolayer can be activated by replacing the leaving group by known methods by any appropriate reactive group. Suitable leaving groups are those already known as taking part in nucleophilic displacement reactions. Suitable nucleophilic (displacing reactants) are generally basic, e.g. hydroxides, alkoxides, amines, halides, mercaptans, alcohols, ethers, cyanates, thiocyanates or carboxylic acids. These reagents can be used to displace a suitable leaving group which may be an anion of a strong or moderately strong acid e.g. halide ions, sulphonic or sulphuric acid anions, —NR$_3$, —OH$_2$, or —OR$_2$ where R is a hydrocarbon group.

In addition to direct chemical modification of the exposed surface of the film, photo-chemical processes can be used to provide reactive groups prior to the addition of further monolayers. Some examples of suitable photo-chemical processes are as follows. A terminal vinyl group can be converted into an alcohol by an electron transfer, photo-initiated reaction in a nucleophilic solvent e.g. by irradiation of a film with terminal vinyl groups immersed in a solution of methyl p-cyanobenzoate in either methanol or isopropyl alcohol. The process of anti-Markownikoff addition of the nucleophile may be used to introduce CN groups e.g. by means of a cyanide salt solution in an acetonitrile/alcohol mixed solvent. Other photosolvolysis reactions may be utilised to modify the terminal groups of the exposed layer of molecules. A further example is the use of leaving groups, e.g. halides, nitriles, acetates, carbonates, ethers, alcohols etc., in particular in conjunction with a benzyl terminal group. Thus the preparation of a chemically active film surface is amenable to both direct and photo-chemical routes.

In order to provide the film with sufficient stability the molecule being deposited preferably has a structure such that the monomolecular layers can be polymerized after formulation. Thus for example the group X can contain ethylenic unsaturation so that the monomolecular layer can be polymerised by known methods.

It is particularly preferred for the molecule being deposited to be a diacetylene. Compounds of this structure can be readily polymerized. In addition films such as polydiacetylene which have a conjugated bond structure are particularly advantageous since this structure has a low energy gap. The diacetylenes in question have the structure

CH$_2$=CH—(CH$_2$)$_m$—C≡C—C≡C—(CH$_2$)$_n$—R where R is a reactive group (e.g. —SiHal$_3$) and m and n are integers. Tri and higher acetylenes can also be used in a similar way. The small layer spacings required for high speed operation of information holding devices may best be achieved by preparing layer structures using diacetylenes in which m and n are both relatively small, e.g. 4 or less.

The diacetylene layers can be polymerized in known manner either after formulation of each monolayer or in a single step following formation of the overall film provided that the regular layer structure can be retained. Polymerization of each deposited layer before activation and deposition of a further layer is preferred. Polymerization by use of UV-radiation in air is preferred since this does not necessitate introduction of a catalyst into the film and dimensional changes are sufficiently small that final films are as perfect as the initial monomeric films. Polymerization of the diacetlyene groups may cause reaction of terminal vinyl groups if these are present. If this presents a problem it can be avoided by selective photopolymerization or by protection of the vinyl groups by a bulky leaving group. For example a bulky group such as I or OR$_2$ (where R is a short hydrocarbon chain) adjacent to the vinyl group can prevent reaction, and this can be removed before the desired chemical modification of the vinyl group is effected. Alternatively, one of the other reactive groups referred to above can be used.

The diacetylenes referred to above where R is —SiHal$_3$ may be prepared by coupling of terminal acetylinic compounds, for example Cadiot-Chodkiewicz coupling, to give an alcohol of formula

CH$_2$=CH—(CH$_2$)$_m$—C≡C—C≡C—(CH$_2$)$_n$—OH

This compound may be chlorinated by using tri-n-butyl phosphine or triphenyl phosphine in carbontetrachloride, converted to a Grignard reagent by the addition of Mg in tetrahydrofuran and silated by reaction of the Grignard reagent with SiHal$_4$ in a suitable solvent such as benzene.

Figure 1:
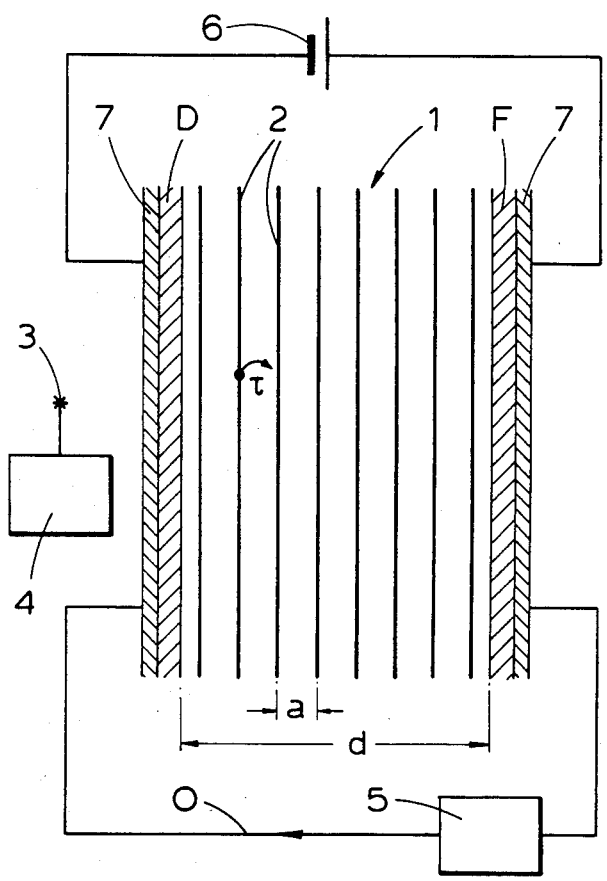
FIG. 1 shows diagrammatically a first embodiment of the invention.

The embodiment shown in FIG. 1 comprises an L-B film 1 formed of a plurality of n layers 2 (eight are illustrated of PDA. The layers are spaced a distance apart from one another and the overall film thickness is d. Adjacent one face of the film 1 is a layer D of electron donor molecules which require a photon energy above $\hbar\omega_D$ to donate $\hbar\omega_D$ is the energy needed to take an electron from the donor layer D and put it in the conductance band of the PDA. A source 3 of photon energy is provided, and the drawing also shows a means 4 for modulating the output of the source 3 in a manner described below. Adjacent the other face of the film 1 is a layer F of molecules which fluoresce on receiving an electron. An optical loop O feeds the output of the layer F back to the layer D. Since the quantum efficiency of the layer D and the layer F is less than unity the loop O must have gain.

For the purposes of amplification the optical signal produced by the layer F could be converted into an electrical signal which could then be amplified, or amplification of the optical signal could take place directly without such conversion. A voltage source 6 applies a d.c. voltage across the film 1 via electrodes 7. In some cases, as will be apparent from what is said below the layers D and F could themselves function as electrodes. An amplifier 5 is diagrammatically shown.

If the loop O is not provided a device of the type described above may still function as a memory, albeit one which holds information only for a brief period of time.

In this case the operation of the device is akin to that of a delay line and is thus regarded, for the purposes of the present invention, as being a type of memory.

To understand the behaviour of the embodiment described above, consider the fate of an extra electron resident in the conduction band of one chain. It diffuses rapidly in the plane. It has a long jump time $\tau$ to the next plane, estimated by Mott type argument as $$1/\tau = \nu \exp(-2 ka) \quad (1)$$

where $\nu$ is a phonon frequency. An estimate of k is given by $$k^2 = 2 mA/\hbar^2 \quad (2)$$

where A is the electron affinity, and m is the electron mass.

So the diffusion coefficient D and mobility $\mu$ in a perpendicular direction are $$D = a^2/\tau, \quad (3)$$

$$\mu = (e/k_BT)D$$

where e is the electron charge, $k_B$ is the Boltzmann constant, and T is the absolute temperature.

There are three regimes of possible applied voltage V across the film:

(A) For $0 < V < K_BT/e = V(l)$ diffusion dominates drift in the perpendicular transport.

(B) For $V(l) < V < n^2 k_B T/e = V(h)$ drift dominates diffusion over the film thickness d but not over the layer separation a.

(C) For $V(h) < V$ drift dominates diffusion even over the layer separation. In this regime the energy difference between an electron in adjacent layers is greater than $K_BT$ and back jumping against the field is rare. The mobility also becomes field dependent.

The transit time across the film due to drift, at velocity v is $t = d/v = d/\mu E = d^2/\mu V$. Using equation 3 then $$t = n^2\tau, v = a/n\tau, \text{ at } V = V(l)$$

$$t = n\tau, v = a/\tau, \text{ at } V = V(h)$$

An approximate estimate of the actual magnitude of the figures involved is as follows.

At room temperature $K_BT/e = 25$ mV which is also V(l).

So for a film of 8 layers V(h)=0.2 volt.

The values of D, $\mu$, $\tau$ and t are exponentially sensitive to a (and A). Taking a=1 nm (i.e. 1 nanometer) and A-4 eV (and $\nu = 10^{14}$ Hz) then $\tau = 8.8$ $\mu$s. So, with a 0.2 volts applied, an electron put on the first layer will jump to adjacent layers every 8.8 $\mu$s and emerge out of layer 8 after 70 $\mu$s.

Because of the above mentioned exponential dependence different devices with small differences of a or A can have large differences of t and $\tau$.

In operation of the above described device the photon energy, for example light, emitted by the source 3 is pulse-code modulated by the modulation means 4, the pulses having a width $< t$ and a period t/n, while the voltage $V > V(h)$ is applied across the film. Because of the synchronism between the period of the pulse train and the jump time for an electron to jump from one plane to the next the pulse train is translated into a corresponding spatial charge distribution across the film. Thus, for example, if the pulse train emitted by the source 3 is 10011010 then after a time equal to t has elapsed there will be a corresponding charge distribution 10011010 across the width of the film, 0 and 1 corresponding respectively to the absence and presence of charge on an individual layer of the film. This charge pattern is continuously cycled through the device by the action of optical loop O.

It is to be understood that although the description of the drawing refers only to a single electron on a particular layer there could in practice be a group of electrons. Thus, consider a device of area $A_c$ containing a charge Q. There is an upper limit to Q at a given applied electric field E, denoted $Q_m$, set by space charge considerations, and given by $$Q_m = \epsilon\epsilon_o A_c E.$$

Here $\epsilon$ and $\epsilon_o$ are the dielectric constant of the medium and permittivity of free space respectively. So in a device of n layers the upper limit to q, the charge on one layer, is $q_m$, and $$q_m \epsilon\epsilon_o A_c E/n.$$

Suppose the arrival of an electron at F leads to the fluorescence of a photon of energy $V_L$ volts with quantum efficiency $\eta$. Then the arrival of one bit at F, over a time duration $\tau$ which is the hop time, gives a maximum fluoresced power P given by $$P = \eta q_m V_L/\tau$$

It may be noted at this stage that the above described device uses electron arrival detection (abbreviated herein as EAD) and an alternative detection method, namely current differentiation (abbreviated herein as CD) is described later on in this description.

The above description refers to the storage of one bit per layer. However, an alternative possibility is to use n layers to store n/M bits, so that the bits are M layers apart. This has the advantage that diffusion, destroying the spatial coherence of the store, is less significant. Using the previous equations, then the criterion for adjacent bits not to diffuse together after N cycles round the device is $V/V(h) > N/M^2$.

Figure 2:
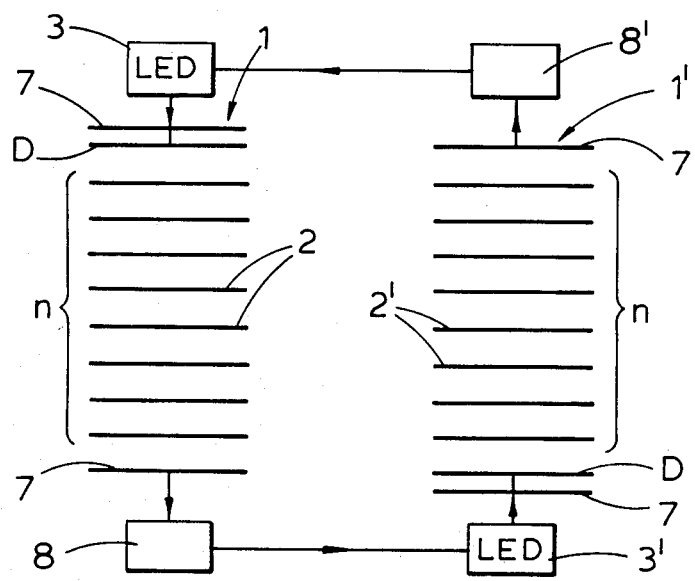
FIG. 2 shows diagrammatically a second embodiment of the invention.

FIG. 2 shows an embodiment employing current differentiation (CD). This comprises a pair of devices 1 and 1' each comprising n layers 2,2' of PDA. Each device has a layer D of electron donor molecules but no layer F as in FIG. 1. Each device is provided with a source 3,3' of photon energy, in the form of a light-emitting diode (LED). Each device is further provided with a current differentiation detector 8,8' for detecting, in a manner described below, the current in the device. The current detector of each device is coupled to the LED of the other device so that information is continuously cycled around the arrangement consisting of the pair of devices. Each device is further provided, as in FIG. 1, with a device (not shown) for modulating the output of the source 3,3' and a voltage source 6 (not shown) for applying a d.c. voltage across the electrodes 7.

Figure 3A:
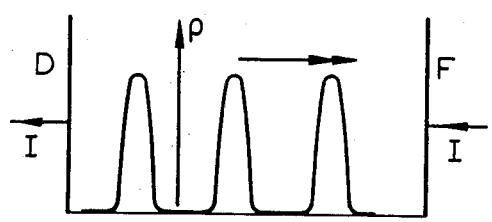
FIGS. 3a to 3f illustrate the detection of charge and current in the devices of the invention.
Figure 3B:
Figure 3C:
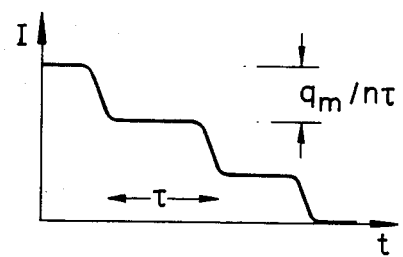
Figure 3D:
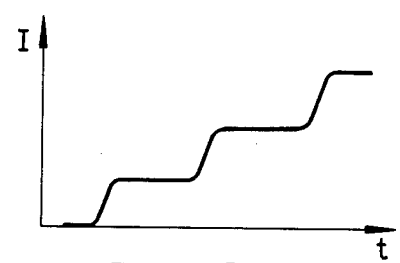
Figure 3E:
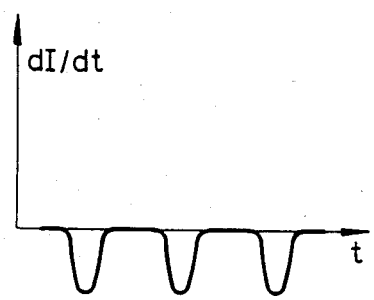
Figure 3F:
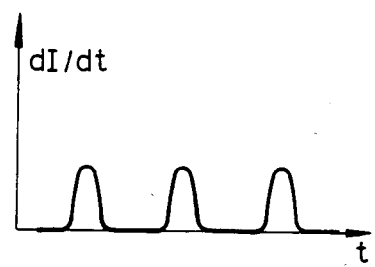

Reference will now be made to FIGS. 3a to 3f which illustrate the operations of electron arrival detection and current differentiation for a bit pattern 0011100. FIG. 3a represents the charge density $\rho$ as a function of position, the double-headed arrow denoting the direction of travel of the bits. The maximum charge in any one bit is $q_m$. FIG. 3b represents the fluoresced power P from the layer F as a function of time t, the maximum power being $\eta q_m V_L/\tau$. This is what is detected by electron arrival detection, as in FIG. 1. FIG. 3c shows the current I due to exit only of the bit pattern, as a function of time. The maximum change in this current over a duration $\tau$ due to the arrival of one bit at F is $$\Delta I = q_m/n\tau.$$

and the maximum change in the current due to the injection of one bit at D over a duration $\tau$ (FIG. 3d) is $\Delta I = q_m/n\tau$. If this current is differentiated with respect to time then dI/dt due to the arrival of one bit at F is a negative peak of duration $\tau$ and height $\Delta I/\tau$ (FIG. 3e), and dI/dt due to the injection of one bit at D is a positive peak of duration $\tau$ and height $\Delta I/\tau$ (FIG. 3f). This current differentiation (CD) method, in contrast to EAD, records entry of bits as well as exit of bits. Moreover they are recorded with different sign. If bits are entering simultaneously with their leaving then CD records no change; in contrast EAD records the exiting bits correctly whether bits are entering or not. The device of FIG. 2 is so arranged so that writing in of bits never overlaps in time the reading out of bits; in addition the signs of connections are chosen so that exiting bits only, and not entering bits, cause entry bits of the next stage.

Another device using CD is described further on in this description.

It should be noted at this point that although the embodiment of FIG. 2 shows the bits being read out on the opposite side of each film 1 to that where they are written in, reading and writing can take place on the same side as one another. This can be achieved by reversing the voltage applied by the voltage source 6 after the last bit has been written in and before there is time for the first bit to emerge from the opposite side of the film. If this is done the bits re-emerge on the same side of the film as that where they were written in, though of course they emerge in the reverse order.

It is even possible in FIG. 1 to read and write on the same side of the film, though in this case it would be necessary to provide a delay in the loop O, which is then a loop running from the write side of the film back to the same side, in order to avoid the bits being written in overlapping with the bits being read out.

The signal to noise ratio of given detectors of fluorescence (EAD) or differentiated current (CD) is determined by the products P$\tau$ and $\tau\Delta I$ respectively. The maximum value of these is:

$$P\tau = \eta q_m V_L = \epsilon\epsilon_o A_C E V_L \eta/n \text{ Joules, EAD,}$$

$$\tau\Delta I = q_m/n = \epsilon\epsilon_o A_C E/n^2 \text{ Coulombs, CD.}$$

Even if $\eta$ is small EAD is more sensitive than CD at sufficiently large n. Increasing the device area and operating field increase the signal strength.

With the numerical example already used, i.e. n=8, a=1 nm (i.e. 1 nanometer), V(h)=0.2 volts, A=4 eV, $v=10^{14}$ Hz, $\tau=8.8$ $\mu$s, and taking in addition $\epsilon=3$, $A_C=10^{-11}$ m² (corresponding to $10^5$ such devices per mm²), V=2 volts, then $$\Delta I = 6\times 10^{-11} \text{ A,}$$

$$P = 8\eta V_L \Delta I \text{ Watts.}$$

Figure 4A:
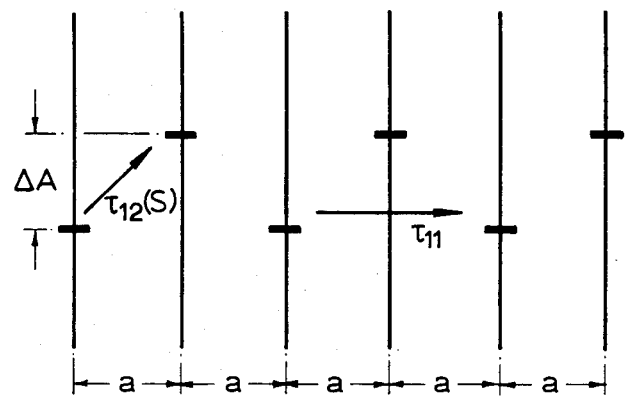
FIGS. 4a and 4b show the energy levels for a multilayer composed of two different materials, for small applied field and large applied field respectively.
Figure 4B:
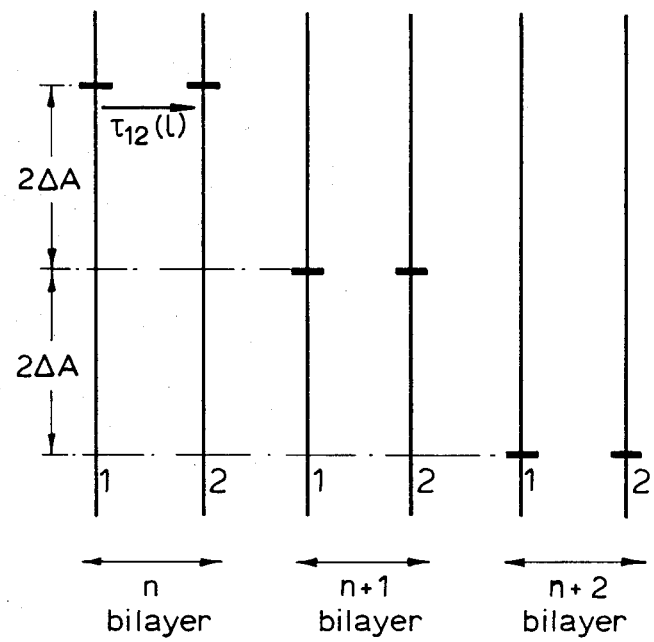

FIG. 4 illustrates diagrammatically a film composed of alternate layers of two different materials, for example two types of PDA, which have different values of electron affinity A, differing by $\Delta A$. Different PDA's of different side groups, have energy gaps differing by up to 0.25 eV and corresponding differences occur also in A. Thus $\Delta A$ can be as large as 10 times the thermal energy $K_B T$ (at room temperature). The jump times denoted in FIGS. 4a and 4b are then $1/\tau_{12}(s) = v \exp(-2 ka) \exp(-\Delta A/k_B T)$, small or zero field, E<$\Delta A$/ea $1/\tau_{12}(l) = v \exp(-2 ka)$, large field, E > $\Delta A$/ea $1/\tau_{11} = v \exp(-4 ka)$.

where $\tau_{12}$ is the jump time from a layer of type 1 to an adjacent layer of type 2, and $\tau_{11}$ is the jump time from one layer of the type 1 to the nearest layer of type 1. Thus $$\tau_{12}(l) << \tau_{12}(s) << \tau_{11}.$$

Suppose these alternating layers are used to store one bit per 2 layers, so that M=2. (It is to be noted that this need not be the case and that there may be a plurality of layers of type 1 between adjacent layers of type 2 and/or a plurality of layers of type 2 between adjacent layers of type 1). Then for the large field jump time is as before and the device behaviour is essentially unchanged (from the previous M=2 case). For the small field however, the bits are essentially frozen in the bi-layers in the highest A chains for the time $\tau_{12}(s)$. Thus the hold time before diffusion destroys the static bit pattern is $\tau_{12}(s)$.

With the previous numerical example, and $\Delta A = 10k_B T$ at room temperature:

$$\tau_{12}(l) = 8.8 \text{ }\mu\text{s}, \tau_{12}(s) = 0.19\text{s, and } \tau_{11} = 2.17 \text{ hours.}$$

Thus, with such PDA alternating layers bits can be written into the device with the high field applied, stored for a time up to $\tau_{12}(s)$ with the field small or zero, and read out of the device with the high field re-applied. This alternating layer device is more complicated than the original device because the applied field now has to be controlled, i.e. it must be turned on and off in synchronism with the bits entering and leaving, but the information holding time is longer.

The read and write field, E=$\Delta A$/ea, is very large. In the numerical example it is $10k_B T$ per layer separation a i.e. 250 mV per 1 nm, i.e. $2.5\times 10^8$ V/m. However, the application of such fields is quite feasible with existing technology.

If the read and write fields are of opposite sign to one another the bits can be written and read at the same side of the multilayer using EAD, since the bits will move in opposite directions under the influence of the two fields.

The last bit in will be in the first bit out. If reading and writing are to be done at separate times, using the long hold time of the alternating layer device, it is possible to abandon EAD and use CD instead.

The hold time can be increased by lowering the temperature and so lengthening $\tau_{12}(s)$ until it equals $\tau_{11}$. In the numerical example this equality occurs at T=140K, below which the hold time would be 2.17 hours. Further lowering of the temperature leaves the hold time unaffected.

As will be apparent, there are two hold times to consider. The first is the hold time before diffusion destroys the bit pattern when the field is on and the bits are being written in or read out. This is the hold time considered in relation to FIG. 1. This time sets the maximum write-read time; i.e. it sets the maximum byte length as limited by diffusion. The second hold time is the time the bit pattern is retained statically in small or zero field before diffusion destroys the bit pattern. These hold times may be referred to respectively as the dynamic hold time and the static hold time. The dynamic hold time can be lengthened by using the previously described technique of storing one bit in M layers of which one has high A and (M-1) have low A. This exponentially lengthens $\tau_{11}$ which is the upper limit to the static hold time which can be reached on lowering the temperature.

With the present numerical example then for M=3 (i.e. where there are 2 layers of type 2 between each layer of type 1) $\tau_{11}$ becomes 200,000 years. At liquid nitrogen temperature, T=77K, $\tau_{12}(s)$ is 6,000 years.

Some materials suitable for forming the various components of the device according to the invention will now be discussed.

The electrodes both apply the electric field across the device and also supply the transit electrons from the D layer and collect the transit electrons at the F layer. They can be metals or doped semiconductors. They can be substrates onto which LB layers are deposited; or they can be evaporated or sputtered onto such LB layers. For semiconductor electrodes with photon energies below the semiconductor band-gap the electrode is transparent; otherwise the electrode is semi-transparent (and opaque if thick).

Figure 5:
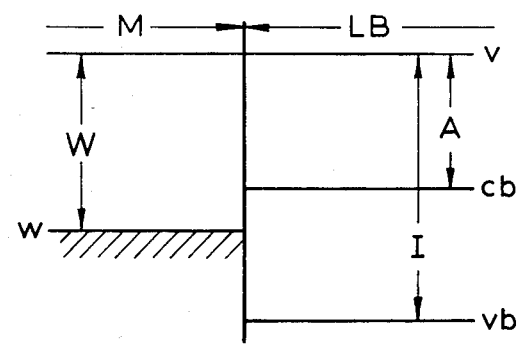
FIGS. 5 to 7 show the energy levels for three arrangements of photo-injector which can be used.

The layer D forming the electron photo-injector can be a metal, in which case D is also the electrode. FIG. 5 shows that the minimum photon energy $\hbar\omega_D$ to photo-inject an electron is given by $\hbar\omega_D$=W-A. The metal electrode is denoted M and the LB layer as LB. v is the reference energy of an unbound electron at rest, cb is the conduction band edge of the material of the LB layer (e.g. PDA) at an energy A below V, vb is the valence band edge of PDA or an energy I below V, and w is the Fermi level of the metal at an energy W below v. The available range of W is large so $\hbar\omega_D$ can virtually be chosen at will.

Suitable metals for use as metal electrodes on PDA crystals include Ag, Al, Au, Cd, Cu, Ga, Hg, In, Mg, Pb, Zn, Sn.

Figure 6:
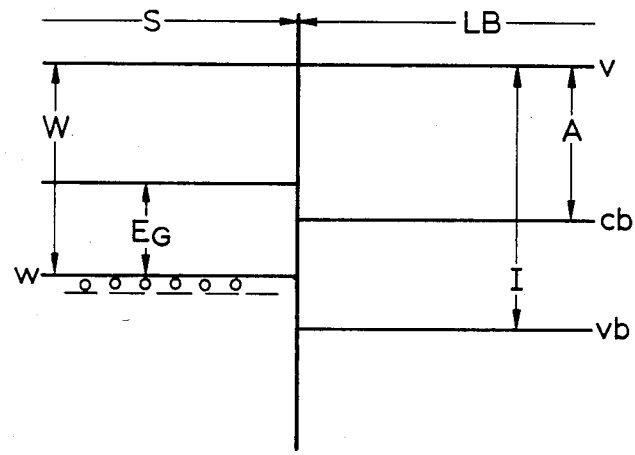

Alternatively D can be a p-type semiconductor, in which case it is also the electrode. FIG. 6 shows that the minimum energy to photo-inject using a semiconductor S is $\hbar\omega_D$=E$_G$(provided A>W-E$_g$). W is the valence band edge of the semiconductor at energy W below v, E$_G$ is the energy gap of the semiconductor, and the other symbols have the same meaning as in FIG. 5. Suitable semiconductors include, Ge,Si,GaAs,GaSb,InP, InAs, InSb,HgTe.

Figure 7:
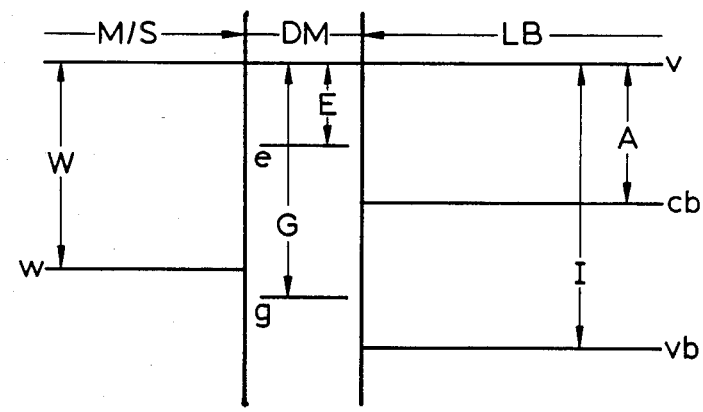

Another possibility is for D to be a dye molecule DM, shown in FIG. 7. The dye is a strong adsorber of photons of energy (G-E), creating an exciton at energy level e. The exciton can auto-ionise to create an electron at level cb and a hole at level w if (G-E)>W-A. The net result of the photon adsorbtion is electron injection. The auto-ionisation will only be efficient if DM is a monolayer. LB monolayers of dye molecules can be produced, as is mentioned below in reference to the layer F. In FIG. 7 w is the Fermi level of a metal or the valence band edge of a semiconductor, depending on whether the electrode is a metal M or a semiconductor S, g is the electronic ground slate of the dye DM at energy G below V, e is the first singlet exciton state of the dye at energy E below v, and the other symbols have the same meaning as in FIGS. 5 and 6.

If (G-E)<2 eV the dye exciton will not propagate in the PDA. If the electrode is a semiconductor of E$_G$>(G-E) the dye exciton will not directly excite the semiconductor. Both these maximise the efficiency of electron injection.

In all cases hole onjection in the dark will not occur for W<I. Photo-injection of holes can be ignored; any such holes will return due to the applied field across the PDA.

Figure 8:
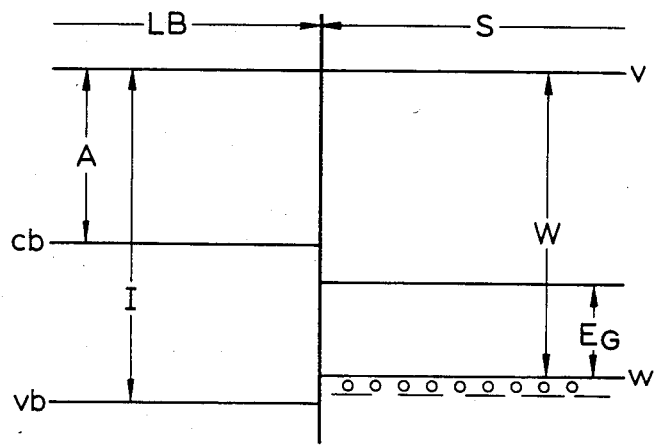
FIGS. 8 to 10 show the energy levels for three arrangements of electron arrival detector which can be used.

The electron arrival detector F can be a p-type semiconductor as shown in FIG. 8. The electron arriving at this electrode can enter the conduction band of the semiconductor provided W-E$_G$>A. The electron is then a minority carrier in the p-type semiconductor and can recombine rapidly by emission of a photo of energy E$_G$. The conditions for such recombination are identical to those required in a semiconductor laser or light-emitting diode, and thus well established. F is then analogous to an LED with the n-type electron injector replaced by the PDA multilayer. It is necessary that W<I so that dark injection of holes does not occur. There is a large range of semiconductors of various E$_G$ and W developed for LED technology from which to choose, including GaAs, GaSb, InP, InAs, InSb, HgTe. The symbols in FIG. 8 have the same meaning as in FIG. 6.

Figure 9:
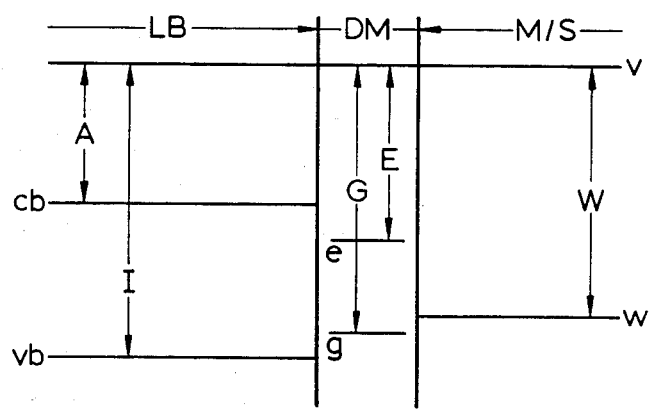

Alternatively, F can be a dye molecule. In a reversal of the exciton auto-ionisation of FIG. 7, FIG. 9 shows creation of the exciton by tunelling of the arriving electron to the electrode. This process requires W-A>(G-E), and that F be a monolayer for efficiency. The subsequent rapid dye fluorescence is the signature of the electorn arrival. The symbols in FIG. 9 have the same meaning as in FIG. 7.

Figure 10:
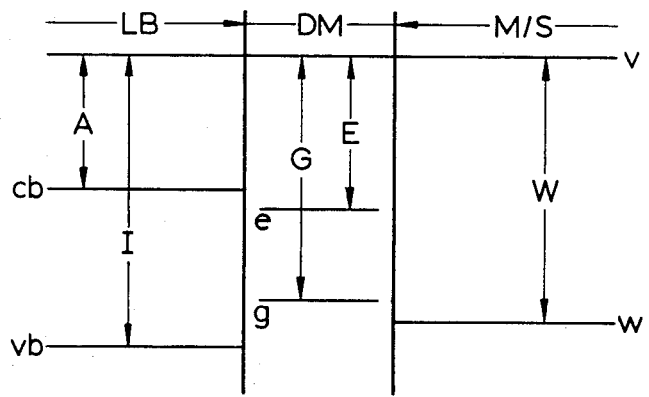

FIG. 10 shows a further scheme not relying on such a tunnelling process in a monolayer, and which would work with thicker dye layers. The symbols have the same meaning as in FIG. 9.

The process involves the following steps:
1. Electron g→w Heat release W-G
2. Electron cb→e Heat release E-A
3. Fluorescence e→g Light emission G-E The net result is an energy release of W-A. For the process to work it is necessary that E>A, G<W, I>W.

Step 1 occurs spontaneously in the dark and creates positiviely charged dye molecules. In other than a monolayer dye the positive charge will migrate in the applied field to the dye molecules adjacent to the PDA. The arriving electron, which is highly mobile along the PDA chain, can then hunt in the plane of the film and find the positively charged dye molecule. At Step 2 the electron enters the dye and forms the exciton. Step 3 is the rapid dye fluorescence. Migration of this exciton can be prevented by the methods described above.

Fluorescing dyes in the required range have been studied at length for their use in dye lasers. Dyes can be put in layers by evaporation. If a dye of suitable values of E and G is incorporated in a molecule from which LB layers can be formed, then the dye can be put as mono-or multilayer at the D or F side of the PDA multilayer. For example, LB layers can be formed from lightly substituted anthracene derivatives with aliphatic side chains, for example a derivative where the side chain has four $CH_2$ units (known as C4) and a derivative where it has six $CH_2$ units (known as C6). Attention is directed in this connection to the journal Phys. Technol. Vol. 12, 1981 pp 69 to 87. Also LB films can be formed of derivatives of perylene to obtain perylene fluorescence in the same way.

The above description has referred to the layers of the memory as being of PDA. However, other materials which form films made up of monomolecular layers can be used instead. Preferably, these are large organic molecules having conjugated unsaturation, because in such molecules the value of I-A is small and there is therefore less chance of impurity and defect trapping of the electrons destroying the spatial coherence of the memory; such molecules may contain rings or linear sequences of single/double bonds. For example, the molecules C4 and C6 mentioned above might be used for the memory, as might a derivative of perylene. Also, molecules of the porphyrin class having conjugated unsaturation form monomolecular layers and can be used for the memory.

The alternating layer device can be made by alternating layers of PDA with layers of molecules such as the C4 or C6 anthracene, or porphyrin, mentioned above. This has the advantage of giving the electron affinity difference $\Delta A$ between the layers more easily controllable by the different molecular constitution of the layers.

Alternatively such alternating layers can be made by mixing in one layer two molecular species. For example, layers can be made with the sequence —(-C≡C—C≡C)— alternating with dye molecules. If such structure is polymerised, then an alternating layer structure suitable for a memory is produced.

A plurality of independent information holding devices can be created in unit area of a film. Three ways in which this can be done are:

(a) The substrate can have a plurality of independent electrodes fabricated by conventional microelectronic techniques before deposition of the layers.

(b) A plurality of independent electrodes can be placed on the layers after their deposition.

(c) The layers of monomer can be polymerised by UV light. If the light passes through a plurality of holes in a mesh, created by conventional microelectronic technique, a corresponding plurality of information holding devices is created.

These present techniques allow a maximum of the order of $10^5$ devices per $mm^2$. This gives a minimum device fabrication per device of $10^{-11} m2$. used in numerical example given herein. In a device of this area with n PDA layers n bits can be held. This compares with conventional devices in which an area several times this size is needed to hold just one bit.

What is claimed:

1. A memory for carrying information comprising a multilayer film built up by successive deposition of a plurality of monomolecular layers, at least one of which has been deposited by a process of chemisorption and in which each layer is capable of carrying a charge; means for introducing charges into one side of the film in a time sequence which corresponds to the information to be carried; means for applying a voltage between the faces of the film to cause the charge carried by any layer to be transferred to the adjacent layer; and means for reading out the sequence of charges carried by the film.

2. A memory according to claim 1, wherein the layers of the film are formed of a polymeric material.

3. A memory according to claim 1 or 2, wherein the layers of the film are formed of a material having conjugated unsaturation.

4. A memory according to claim 3, wherein at least some of the layers of the film are formed of a polydiacetylene.

5. A memory according to claim 1, wherein said means for introducing charges is arranged to do so in response to input signals representing said information in the form of pulses of photon energy.

6. A memory according to claim 5, wherein the means for introducing charges comprises a layer of a semiconductor.

7. A memory according to claim 5, wherein the means for introducing charges comprises a layer of a photo-injecting metal.

8. A memory according to claim 5, wherein the means for introducing charges comprises a dye monolayer sandwiched between the said film and an electrode.

9. A memory according to claim 1, wherein the means for reading out is located adjacent a face of the film on the opposite side thereof to that adjacent which the means for introducing charges is located.

10. A memory according to claim 1, wherein the means for reading out is located on the same side of the film as the means for introducing charges.

11. A memory according to claim 9 or 10, wherein the means for reading out comprises means adapted to emit photon energy in response to the transfer of charges thereto from the said film.

12. A memory according to claim 11, wherein the means for reading out comprises a layer of a p-type semiconductor.

13. A memory according to claim 11, wherein the means for reading out comprises a dye monolayer sandwiched between the said film and an electrode, the dye being such that an excitation is created therein by tunnelling of an electron to the electrode, whereupon the dye fluoresces.

14. A memory according to claim 11, wherein the means for reading out comprises a layer of a dye sandwiched between the said film and an electrode, the dye being such that positively charged dye molecules are created spontaneously by movement of electrons therefrom into the electrode, whereby electrons arriving from the said film in the dye can create an exciton which in its turn causes the dye to fluoresce.

15. A memory according to claim 1, wherein the means for reading out comprises means for detecting the current flowing in the device, and means for differentiating that current with respect to time.

16. A memory according to claim 1, including a feedback path from the said reading out means to the said means for introducing changes whereby the introduced charges are continuously cycled in the memory.

17. A memory according to claim 1, wherein the film is composed of layers of at least two materials having different electron affinities, at least one layer of one of the materials being sandwiched between adjacent layers, or groups of layers, of the other of the materials.

18. A memory according to claim 17, comprising means for cooling the film.

19. A memory according to claim 17 or 18, wherein the means for reading out is located on the same side of the film as the means for introducing charges.

* * * * *